(12) United States Patent
Mao et al.

(10) Patent No.: US 11,714,467 B2
(45) Date of Patent: Aug. 1, 2023

(54) IMMERSION COOLING TANK AND COOLING SYSTEM

(71) Applicant: Fulian Precision Electronics (Tianjin) Co., LTD., Tianjin (CN)

(72) Inventors: Tze-Chern Mao, New Taipei (TW); Yen-Chun Fu, New Taipei (TW); Chih-Hung Chang, New Taipei (TW); Yao-Ting Chang, New Taipei (TW); Li-Wen Chang, New Taipei (TW); Chao-Ke Wei, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 45 days.

(21) Appl. No.: 17/499,788

(22) Filed: Oct. 12, 2021

(65) Prior Publication Data
US 2022/0039288 A1  Feb. 3, 2022

Related U.S. Application Data

(62) Division of application No. 16/988,886, filed on Aug. 10, 2020, now Pat. No. 11,169,582, which is a
(Continued)

(30) Foreign Application Priority Data

Feb. 12, 2019 (CN) .......................... 201910111026.6

(51) Int. Cl.
*H05K 7/00* (2006.01)
*H05K 7/20* (2006.01)
(Continued)

(52) U.S. Cl.
CPC ............. *G06F 1/20* (2013.01); *F28D 1/0206* (2013.01); *H01M 10/613* (2015.04); *H01M 10/6568* (2015.04); *G06F 2200/201* (2013.01)

(58) Field of Classification Search
CPC ............... H05K 7/203; H05K 7/20236; H05K 7/20281; H05K 7/20772; H05K 7/20781;
(Continued)

(56) References Cited

U.S. PATENT DOCUMENTS

2002/0021555 A1\* 2/2002 Hamman .................. G06F 1/20
257/E23.098
2006/0023424 A1\* 2/2006 Nakamura ......... G01R 31/2875
361/699

(Continued)

FOREIGN PATENT DOCUMENTS

| CN | 106659083 A | 5/2017 |
|---|---|---|
| CN | 207589381 U | 7/2018 |
| CN | 109287093 A | 1/2019 |

*Primary Examiner* — Xiaoliang Chen
(74) *Attorney, Agent, or Firm* — ScienBiziP, P.C.

(57) ABSTRACT

An immersion cooling tank includes a tank body and a liquid flow tube. The tank body holds a coolant and an electronic device. The tank body defines an inlet and an outlet. The inlet and the outlet are respectively located at opposite ends of the electronic device for inputting and outputting the coolant. The coolant flows through the electronic device. The liquid flow tube includes at least one adjuster. The liquid flow tube is located inside the tank body and coupled to at least one of the inlet or the outlet. The at least one adjuster faces the electronic device for controlling an amount of the coolant flowing in or out of the tank body.

7 Claims, 5 Drawing Sheets

Related U.S. Application Data division of application No. 16/296,363, filed on Mar. 8, 2019, now Pat. No. 10,775,858.

(51) Int. Cl.
*F28D 15/02* (2006.01)
*F28D 15/06* (2006.01)
*G06F 1/20* (2006.01)
*H01M 10/613* (2014.01)
*H01M 10/6568* (2014.01)
*F28D 1/02* (2006.01)

(58) Field of Classification Search
CPC ........... H05K 7/20809; H05K 7/20827; H05K 7/20818; F28D 15/02; F28D 15/06; F28D 15/0266; G06F 1/20; G06F 1/206; H01L 2924/00; H01L 2924/0002
USPC ..... 361/701, 699, 700, 702, 679.31, 679.46, 361/679.53; 165/67, 96, 104.13, 104.19, 165/281, 287, 301
See application file for complete search history.

(56) References Cited

U.S. PATENT DOCUMENTS

| | | | |
|---|---|---|---|
| 2006/0032627 A1* | 2/2006 | Nakamura ......... | G05D 23/1919 165/287 |
| 2014/0216686 A1* | 8/2014 | Shelnutt ................. | H05K 7/203 165/96 |
| 2014/0216688 A1* | 8/2014 | Shelnutt .............. | F28D 15/0266 165/104.13 |
| 2014/0216711 A1* | 8/2014 | Shelnutt .............. | F28D 15/0266 165/104.19 |
| 2014/0218858 A1* | 8/2014 | Shelnutt ................. | H05K 7/203 361/679.31 |
| 2014/0218859 A1* | 8/2014 | Shelnutt ............. | H05K 7/20809 361/679.46 |
| 2014/0218861 A1* | 8/2014 | Shelnutt ............. | H05K 7/20818 361/679.53 |
| 2015/0060009 A1* | 3/2015 | Shelnutt ................. | H05K 7/203 165/11.1 |
| 2015/0062806 A1* | 3/2015 | Shelnutt ............. | H05K 7/20318 361/679.53 |
| 2015/0070846 A1* | 3/2015 | Shelnutt ............. | H05K 7/20809 361/699 |
| 2017/0013744 A1* | 1/2017 | Shelnutt ............. | H05K 7/20809 |

* cited by examiner

IMMERSION COOLING TANK AND COOLING SYSTEM

FIELD

The subject matter herein generally relates to cooling systems, and more particularly to a cooling system and an immersion cooling tank.

BACKGROUND

Servers generate large amounts of heat. One way to cool a server is to immerse the server in a tank with coolant. However, due to uneven flow rates of the coolant, the coolant adjacent to an outlet of the tank flows slower than the coolant further away from the outlet, which causes uneven dissipation of heat of the server.

BRIEF DESCRIPTION OF THE DRAWINGS

Implementations of the present disclosure will now be described, by way of embodiments, with reference to the attached figures.

DETAILED DESCRIPTION

Figure 1:
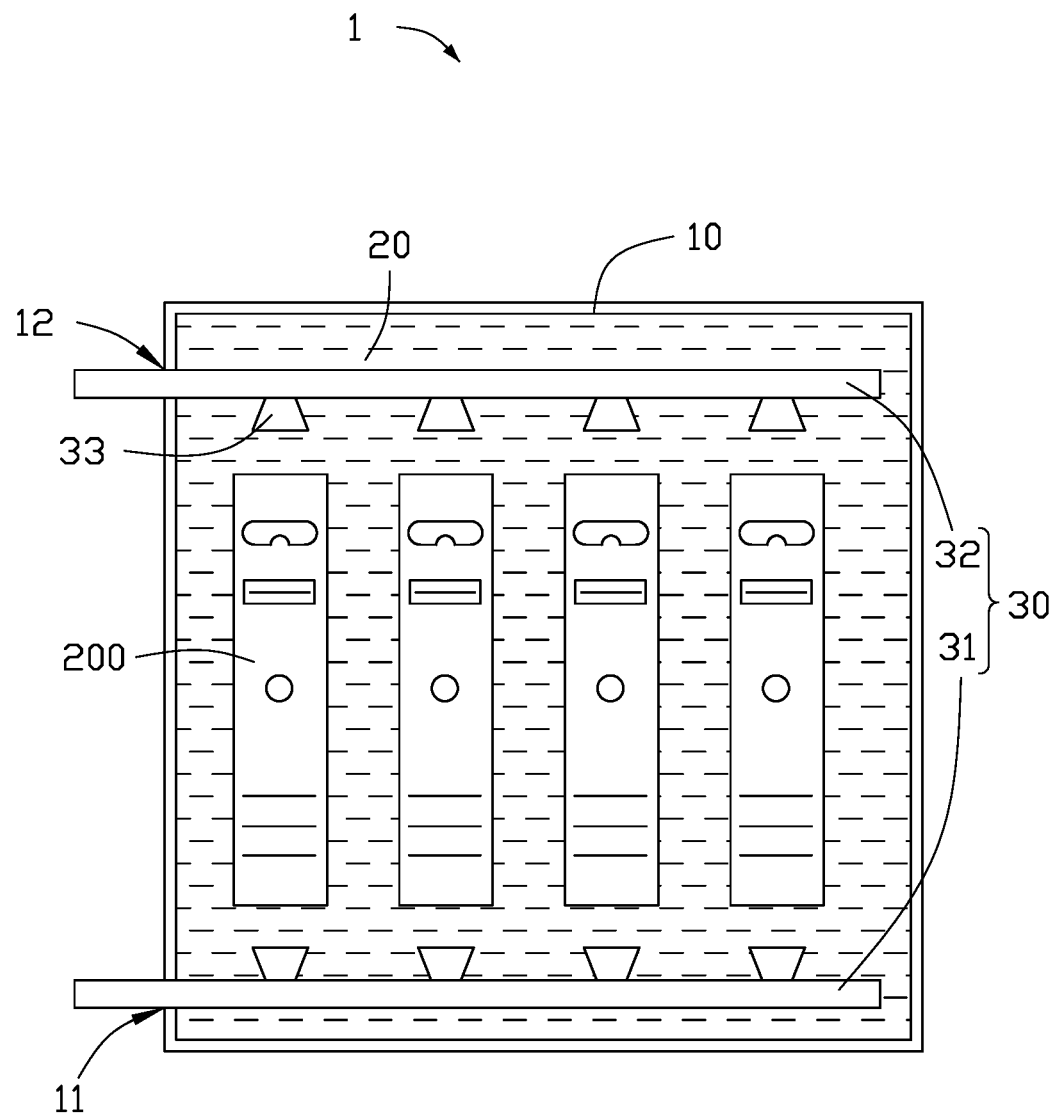
FIG. 1 is a schematic diagram of a first embodiment of an immersion cooling tank according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

First Embodiment

Figure 2:
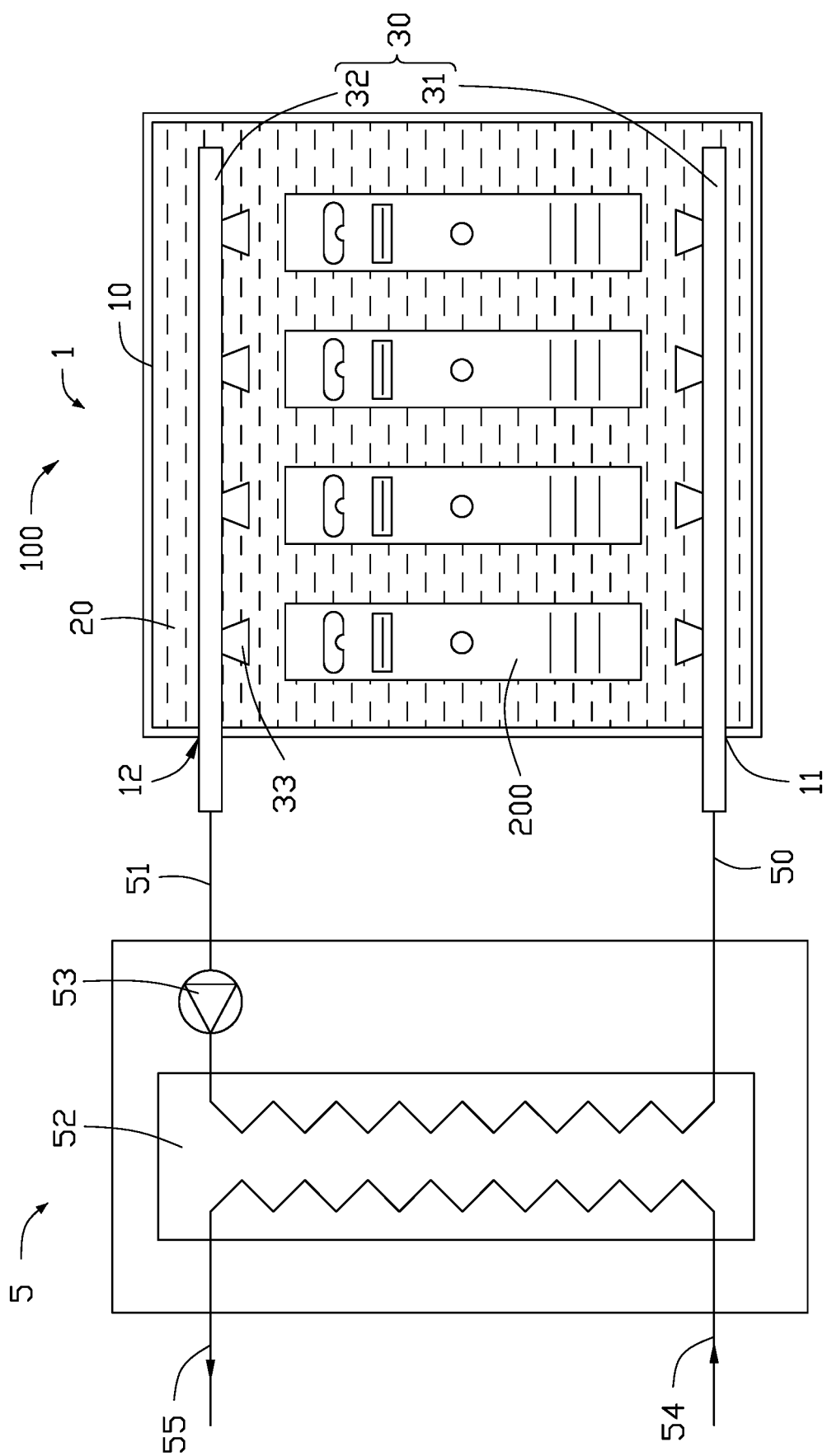
FIG. 2 is a schematic diagram of a cooling system and the immersion cooling tank of FIG. 1 according to the present disclosure.

Referring to FIGS. 1 and 2, a cooling system 100 for cooling an electronic device 200 includes an immersion cooling tank 1 and a cold source distributor 5. The immersion cooling tank 1 is connected to the cold source distributor 5. The immersion cooling tank 1 is used for holding a coolant 20 to soak the electronic device 200, and the cold source distributor 5 provides the coolant 20 to the immersion cooling tank 1 and performs heat exchange for the coolant 20, so as to continuously provide the immersion cooling tank 1 with the coolant 20.

The immersion cooling tank 1 includes a tank body 10 and a liquid flow tube 30. The liquid flow tube 30 is located inside the tank body 10 and connected to the tank body 10. The coolant 20 flows into the tank body 10 or out of the tank body 10 through the liquid flow tube 30.

Referring to FIG. 1, an inlet 11 and an outlet 12 are defined in the tank body 10. The inlet 11 and the outlet 12 are located at opposite ends of the electronic device 200 for inputting and outputting the coolant 20. The liquid flow tube 30 is provided with an adjuster 33, and an end of the liquid flow tube 30 is connected to at least one of the inlet 11 or the outlet 12 inside the tank body 10. The adjuster 33 faces the electronic device 200 to control the inflow or outflow of the coolant 20.

When the electronic device 200 is immersed in the tank body 10 for cooling, the coolant 20 flows through the electronic device 200. The liquid flow tube 30 connected to the inlet 11 or the outlet 12 of the tank body 10 controls the amount of the coolant 20 flowing into or out of the tank body 10 through the adjuster 33 so that the coolant 20 in the tank body 10 flows uniformly, and the electronic device 200 is cooled uniformly.

In one embodiment, in order to better cool the electronic device 200, the inlet 11 and the outlet 12 are respectively provided at a lower end and an upper end of the tank body 10. It can be understood that the positions of the inlet 11 and the outlet 12 can be switched, such that the inlet 11 is provided at the upper end, and the outlet 12 is provided at the lower end. The inlet 11 and the outlet 12 can also take on other forms. The coolant 20 flowing from the inlet 11 flows through the electronic device 200 and carries the heat generated by the electronic device 200 through the outlet 12.

In one embodiment, the liquid flow tube 30 includes a first flow tube 31 and a second flow tube 32. One end of the first flow tube 31 is connected to the inlet 11, and one end of the second flow tube 32 is connected to the outlet 12. The first flow tube 31 and the second flow tube 32 are provided at opposite ends of the electronic device 200 and arranged in parallel.

Figure 3:
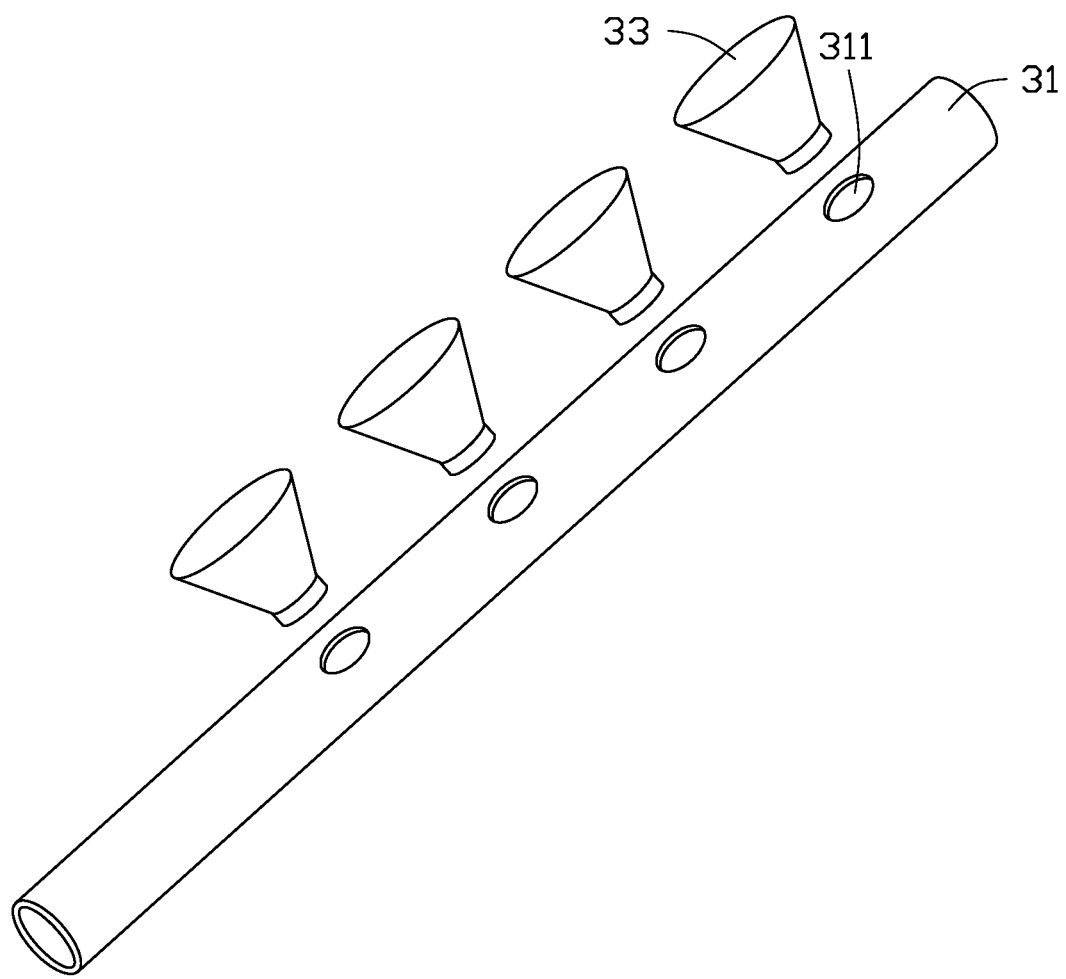
FIG. 3 is a diagram of a first flow tube and a plurality of adjusters of the immersion cooling tank according to the present disclosure.

Referring to FIGS. 1 and 3, the first flow tube 31 and the second flow tube 32 define a plurality of openings 311 facing the electronic device 200. The plurality of openings 311 are arranged in parallel on the first flow tube 31 and the second flow tube 32.

Referring to FIG. 1, the first flow tube 31 and the second flow tube 32 each include a plurality of adjusters 33. The plurality of adjusters 33 is mounted in the openings 311 and communicates with the first flow tube 31 and the second flow tube 32 so that the coolant 20 in the first flow tube 31 and the second flow tube 32 can flow out from or flow into the adjusters 33.

In one embodiment, the first flow tube 31 and the second flow tube 32 are each provided with four adjusters 33. It can be understood that, in other embodiments, the number of the adjusters 33 may be more or less according to the structures of the first flow tube 31 and the second flow tube 32. The adjuster 33 has a substantially truncated cone shape. In other embodiments, the shape of the adjuster 33 is not limited thereto.

Referring to FIG. 2, the cold source distributor 5 is located on one side of the tank body 10 and connected to the inlet 11 and the outlet 12 of the tank body 10. The cold source distributor 5 includes a cold source tube 50, a heat return tube 51, and a heat exchanger 52. One end of the cold source tube 50 is connected to the inlet 11, and one end of the heat return tube 51 is connected to the outlet 12. The other ends of the cold source tube 50 and the heat return tube 51 are connected to the heat exchanger 52, and a pump 53 is located between the heat return tube 51 and the heat exchanger 52. The pump 53 causes the coolant 20 to flow out of the tank body 10 to the cold source distributor 5. The cold source tube 50 provides cooled coolant 20 to the tank body 10, and the heat return tube 51 transfers the heated coolant 20 to the cold source distributor 5.

The cold source distributor 5 further includes a cooling nozzle 54 and a heat return nozzle 55. One end of the cooling nozzle 54 and one end of the heat return nozzle 55 are connected to the heat exchanger 52. The cooling nozzle 54 provides cooling water to the heat exchanger 52, and the heat return nozzle 55 transports heated water from the heat exchanger 52 out of the heat exchanger 52. Specifically, in the cold source distributor 5, the cooling water is transported to the heat exchanger 52 through the cooling nozzle 54, and the heated coolant 20 is cooled by the cooling water and then transported to the tank body 10. After the coolant 20 absorbs heat from the electronic device 200 and becomes heated, the heated coolant 20 is output through the heat return tube 51 to the heat exchanger 52 through the pump 53. After the heated coolant 20 exchanges the heat with the cooling water provided by the cooling nozzle 54, the coolant 20 is transported to the tank body 10 through the cold source tube 50 again. The cooling water that has undergone heat exchange with the heated coolant 20 becomes heated and is output from the cold source distributor 5 through the heat return nozzle 55. It can be understood that the heated water output from the cold source distributor 5 can be reused with minimal waste.

Referring to FIGS. 1, 2, and 3, a plurality of electronic devices 200 is placed in the tank body 10 for cooling. The cold source distributor 5 provides the tank body 10 with the coolant 20. The coolant 20 flows through the first flow tube 31 connected to the inlet 11 and is discharged from the adjusters 33 into the tank body 10. The amount of the coolant 20 around the electronic device 200 adjacent to the inlet 11 and the amount of coolant 20 around the electronic devices 200 further away from the inlet 11 are uniform, and the heat generated by the electronic devices 200 is transferred to the coolant 20.

The pump 53 of the cold source distributor 5 drives the heated coolant 20 to flow through the adjusters 33 of the second flow tube 32 and the heat return tube 51 into the heat exchanger 52. In the heat exchanger 52, the heated coolant 20 performs the heat exchange with the cooling water, then the coolant 20 is transported back into the tank body 10, and the heated cooling water is transported through the heat return nozzle 55 out of the cold source distributor 5. The electronic devices 200 are cooled by the coolant 20 circulating between the cold source distributor 5 and the immersion cooling tank 1.

In this embodiment, the electronic devices 200 are servers. It can be understood that the electronic devices 200 may also be other devices capable of generating heat.

Second Embodiment

Figure 4:
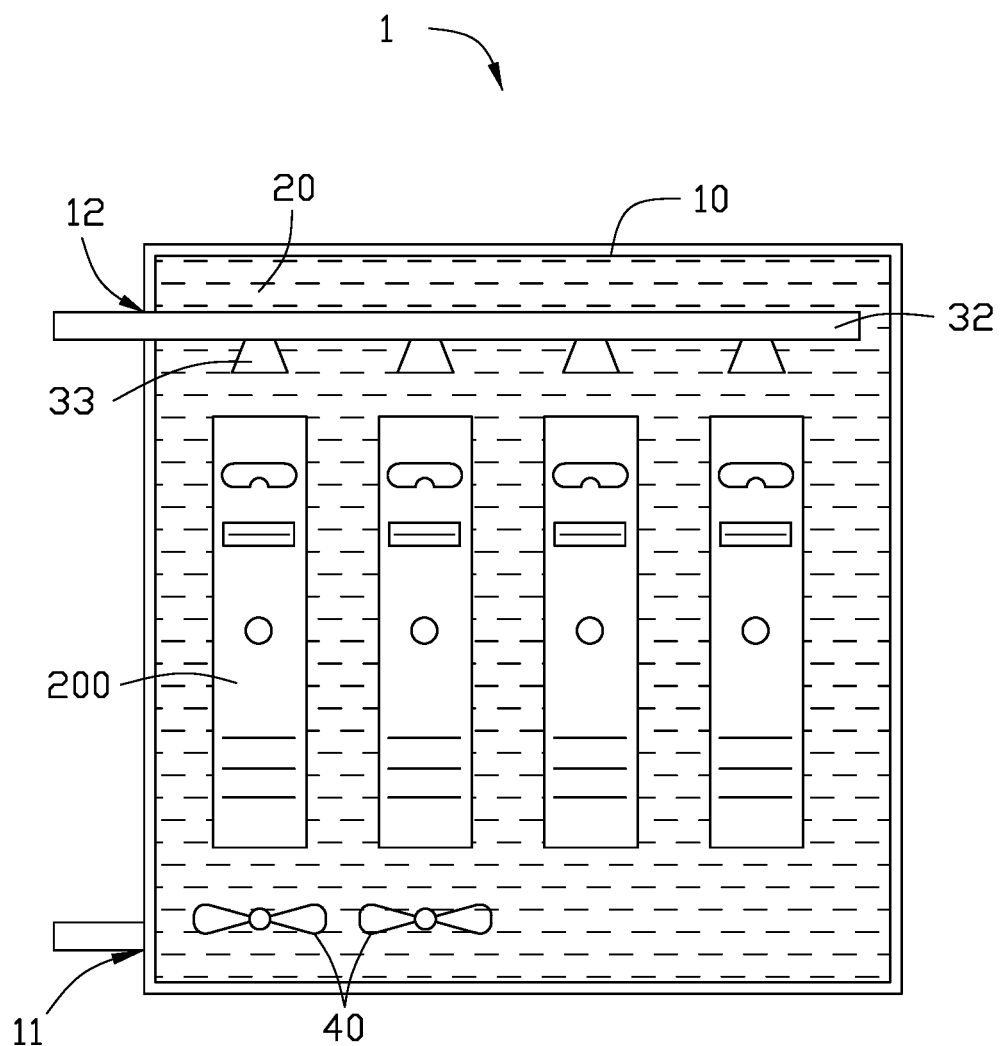
FIG. 4 is a schematic diagram of a second embodiment of the immersion cooling tank according to the present disclosure.
Figure 5:
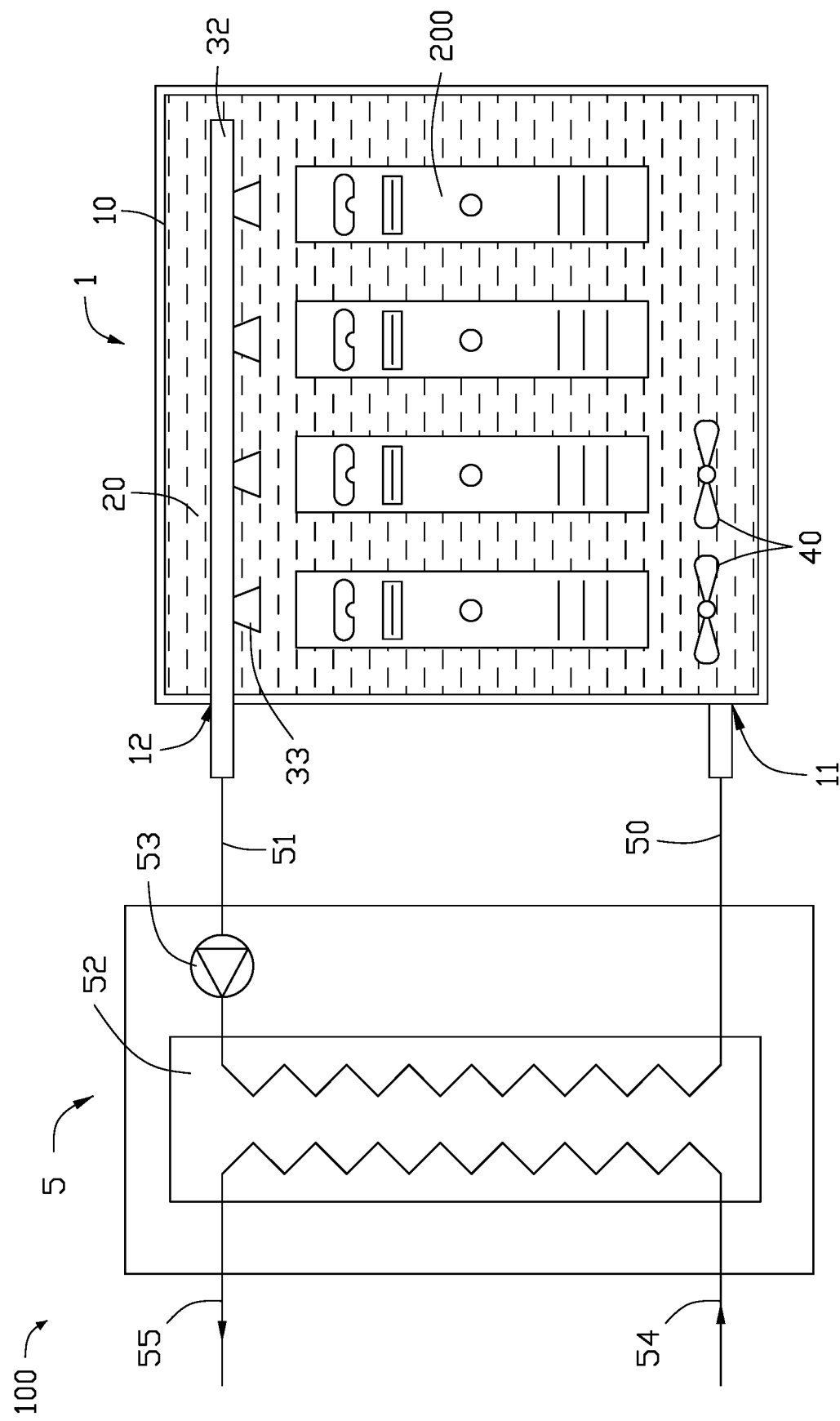
FIG. 5 is a schematic diagram of a cooling system and the immersion cooling tank of FIG. 4 according to the present disclosure.

Referring to FIG. 3, FIG. 4, and FIG. 5, a second embodiment of the immersion cooling tank 1 differs from the first embodiment in that the first flow tube 31 is omitted from the inlet 11 of the tank body 10. Instead, a driving member 40 for driving the coolant 20 is provided at one end of the electronic devices 200 adjacent to the inlet 11. The driving member 40 and the second flow tube 32 are respectively arranged at opposite ends of the electronic device 200.

Referring to FIG. 4, a driving direction of the driving member 40 is the same as a flow direction of the coolant 20. In one embodiment, the driving member 40 is a fan blade. It can be understood that the driving member 40 can also be replaced with other structures capable of driving the coolant 20 in the tank body 10. One driving member 40 is provided at a lower end of each of two electronic devices 200 adjacent to the inlet 11. It can be understood that the coolant 20 adjacent to the inlet 11 flows faster than the coolant 20 flowing upwards. Therefore, the driving members 40 located adjacent to the inlet 11 increase the flow of the coolant 20 flowing through the electronic devices 200.

When the coolant 20 flowing into the tank body 10 passes through the driving member 40 to the second flow tube 32, the coolant 20 takes away the heat generated by the electronic devices 200, and then flows out of the tank body 10 through the second flow tube 32.

In summary, the embodiments of the present disclosure provide the immersion cooling tank 1 and the cooling system 100 for uniformly cooling the electronic devices 200, thereby avoiding uneven cooling of the electronic devices 200 due to uneven flow rates of the coolant 20 adjacent to the inlet 11 or the outlet 12.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An immersion cooling tank comprising:
   a tank body configured to hold a coolant and an electronic device, the tank body defining an inlet and an outlet, the inlet and the outlet respectively located at opposite ends of the electronic device for inputting and outputting the coolant, the coolant flowing through the electronic device; and
   a liquid flow tube comprising at least one adjuster, the liquid flow tube being located inside the tank body and coupled to at least one of the inlet or the outlet, the at least one adjuster facing the electronic device and adapted for controlling an amount of the coolant flowing in or out of the tank body;
   wherein the liquid flow tube is coupled to the outlet, the tank body comprises at least one driving member configured for driving the coolant to flow, and the liquid flow tube and the at least one driving member are respectively located at opposite ends of the electronic device.

2. The immersion cooling tank of claim 1, wherein the liquid flow tube comprises a first flow tube and a second flow tube; the first flow tube is coupled to the inlet, and the second flow tube is coupled to the outlet; the first flow tube and the second flow tube are respectively located at opposite ends of the electronic device and arranged in parallel; the coolant enters the tank body through the first flow tube, flows pass the electronic device, then flows to the second flow tube.

3. The immersion cooling tank of claim 1, wherein the coolant flows in a direction from the at least one driving member to the electronic device, and the coolant carries heat generated by the electronic device to the liquid flow tube.

4. The immersion cooling tank of claim 3, wherein the at least one driving member is located adjacent to the inlet; and a driving direction of the at least one driving member is the same as a flow direction of the coolant.

5. The immersion cooling tank of claim 3, wherein the at least one driving member is a fan blade.

6. The immersion cooling tank of claim 1, wherein the liquid flow tube defines at least one opening facing the electronic device; the at least one adjuster is mounted in the at least one opening and communicates with the liquid flow tube.

7. The immersion cooling tank of claim 6, wherein the liquid flow tube defines a plurality of openings arranged in parallel.

\* \* \* \* \*